(12) United States Patent
Brass et al.

(10) Patent No.: US 6,307,664 B1
(45) Date of Patent: Oct. 23, 2001

(54) THERMOCHROMIC GAME PIECE

(76) Inventors: Jack Brass, 96 Hillmount Avenue North, Toronto, Ontario (CA), M6B 1X6; Julius Diamond, 19 Ridge Hill, Toronto, Ontario (CA), M6C 2J2

( * ) Notice: Subject to any disclaimer, the term of this patent is extended or adjusted under 35 U.S.C. 154(b) by 0 days.

(21) Appl. No.: 09/403,156
(22) PCT Filed: Apr. 15, 1998
(86) PCT No.: PCT/IB98/00763
§ 371 Date: Feb. 14, 2000
§ 102(e) Date: Feb. 14, 2000
(87) PCT Pub. No.: WO98/47012
PCT Pub. Date: Oct. 22, 1998

Related U.S. Application Data
(60) Provisional application No. 60/042,233, filed on Apr. 15, 1997.
(51) Int. Cl.[7] .............................. G02F 1/01; B42D 15/00
(52) U.S. Cl. ............................................. 359/288; 283/87
(58) Field of Search ............................. 359/288; 283/87, 283/72

(56) References Cited

U.S. PATENT DOCUMENTS

| | | | |
|---|---|---|---|
| 5,344,191 | 9/1994 | Chang et al. | 283/72 |
| 5,867,028 | * 2/1999 | Bailey | 324/435 |
| 5,925,480 | * 7/1999 | Shacklett, III et al. | 429/93 |
| 6,156,450 | * 12/2000 | Bailey | 429/93 |

FOREIGN PATENT DOCUMENTS

| | | | |
|---|---|---|---|
| 0 450 938 A2 | 10/1991 | (EP) | G01R/31/36 |
| 0 473 447 A2 | 3/1992 | (EP) | B41J/2/525 |

OTHER PUBLICATIONS

Patent Abstracts of Japan, vol. 96, No. 9, 30 (Sep. 1996 & 08 126775 A (Tomatsu Tsutomu), May 21, 1996.

* cited by examiner

*Primary Examiner*—Ricky Mack
(74) *Attorney, Agent, or Firm*—Renner, Otto, Boisselle & Sklar, LLP

(57) ABSTRACT

A thermochromic game or prize or message indicator includes a typical thermochromic or thermally sensitive battery testers coupled to a first conductive substrate with a second thermally responsive game piece or prize or message indicator of the present invention combines a typical thermochromic or thermally sensitive battery tester coupled to the conductive substrate with an extension of the conductive substrate. The thermochromic game or prize of message indicator can be used to display a verbal message or icon for conveying whether a prize has been won. Additionally, the thermochromic game or prize or message indicator can be used to display any desired verbal message or icon.

16 Claims, 2 Drawing Sheets

THERMOCHROMIC GAME PIECE

This application claims priority from U.S. patent application Ser. No. 60/042,233, filed Apr. 15, 1997.

TECHNICAL FIELD

This invention relates generally to a thermochromic game piece or prize or message indicator, and, more particularly, to a thermally responsive game piece or prize or message indicator that may be incorporated with a battery tester mounted directly to a battery or to the battery packaging.

BACKGROUND OF THE INVENTION

A typical thermochromic or thermally sensitive battery tester includes a conductive substrate which is capable of generating heat when a voltage source is applied thereto and a thermally responsive display thermally coupled to the conductive layer. When the conductive layer is electrically coupled to the terminals of a battery to be tested, the conductive layer generates heat as a function of the voltage generated by the battery. The thermally responsive material of the thermally responsive display responds to the heat generated by the conductive layer to provide a visual indication of the charge state of the battery being tested. Battery testers of this variety are typically incorporated into the battery packaging or may be provided directly on the battery housing.

However, the above-battery testers only serve to determine the amount of charge left in a battery.

It would be desirable to provide a battery tester which could, in addition to determining the amount of charge left in a given battery, also act as a game piece or prize or message indicator.

It would also be desirable to provide a game piece or prize or message indicator that could be incorporated directly onto a battery or battery packaging.

SUMMARY OF THE INVENTION

The present invention is a thermally responsive game piece or prize or message indicator that may be incorporated with a battery tester mounted directly to a battery or to the battery packaging. Examples of battery testers with which the game piece may be used are those described in U.S. Pat. Nos. 5,389,470; 5,059,895; 4,702,564 and 5,604,049, although the game piece may be used with other battery testers or alone or in conjunction with other devices. The entire disclosures of U.S. Pat. Nos. 5,389,470; 5,059,895; 4,702,564 and 5,604,049 are incorporated by their reference.

The thermally responsive game piece or prize or message indicator of the present invention combines, for example, a typical thermochromic or thermally sensitive battery testers coupled to a first conductive substrate with a second thermally responsive display which is coupled to a second conductive substrate.

Alternatively, the thermally responsive game piece or prize or message indicator of the present invention combines, for example, a typical thermochromic or thermally sensitive battery testers coupled to the conductive substrate with an extension of the conductive substrate.

In one embodiment the thermochromic game piece is mounted directly on a battery.

In one embodiment the thermochromic game piece contains a desired message indicia which can be a prize determining indicia.

In another embodiment the thermochromic game piece contains a desired message indicia which is selected from the group consisting of a printed verbal message, an icon and a color change.

Also disclosed is a method for delivering a message via a thermochromic game piece comprising the steps of placing a battery into contact with a thermally responsive prize verification display via a conductive substrate; and generating heat to produce a visual indication in the thermally responsive prize verification display, wherein the thermally responsive prize verification display reveals a desired message indicia.

In another embodiment the method for delivering a message via a thermochromic game piece comprises the steps of placing a battery into contact with a thermochromic batter tester and a thermally responsive prize verification display via a first and second conductive substrate respectively; and generating heat to produce a visual indication in the thermally responsive prize verification display, wherein the thermally responsive prize verification display reveals a desired message indicia.

DETAILED DESCRIPTION OF THE PREFERRED EMBODIMENTS

A typical thermochromic or thermally sensitive battery tester includes a conductive substrate which is capable of generating heat when a voltage source is applied thereto and a thermally responsive display thermally coupled to the conductive layer. When the conductive layer is electrically coupled to the terminals of a battery to be tested, the conductive layer generates heat as a function of the voltage generated by the battery. The thermally responsive material of the thermally responsive display responds to the heat generated by the conductive layer to provide a visual indication of the charge state of the battery being tested. Battery testers of this variety are typically incorporated into the battery packaging or may be provided directly on the battery housing.

Figure 1:
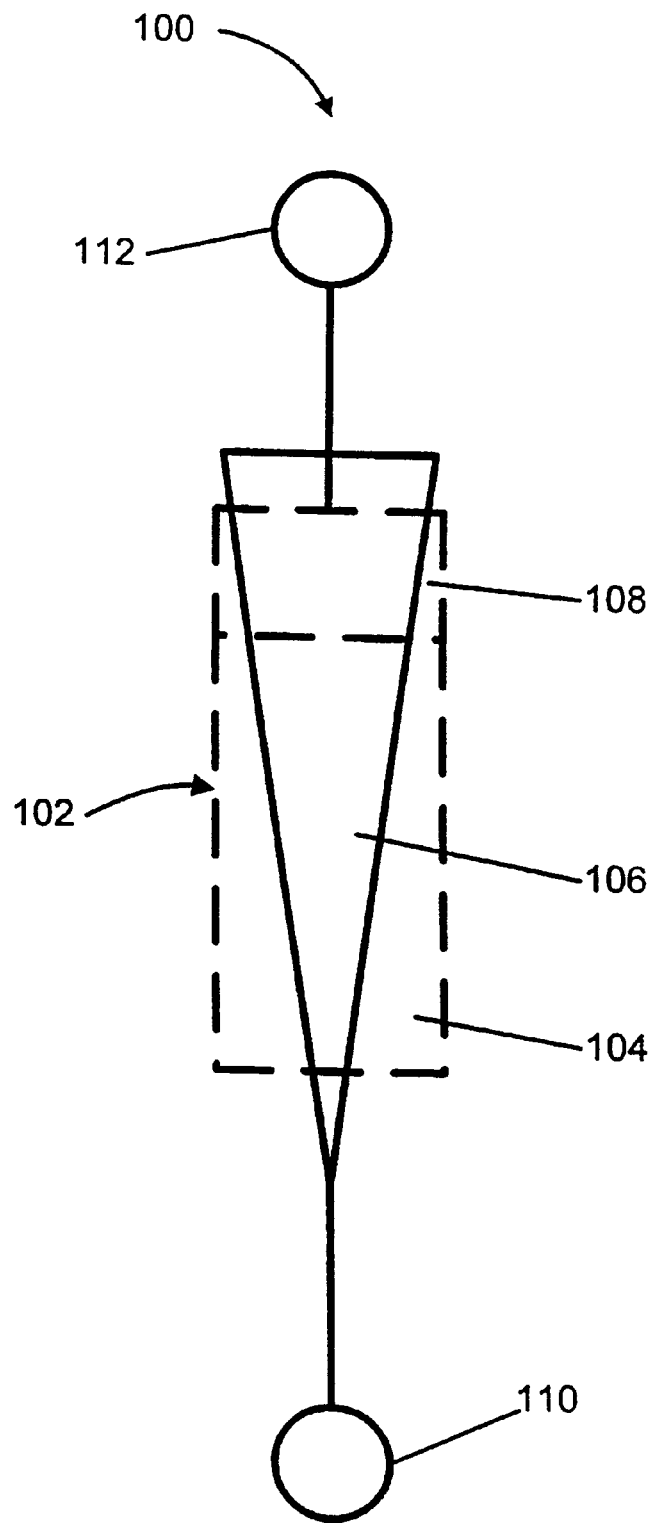
FIG. 1 is a schematic illustration of the circuit of one embodiment of the present invention.

With reference to the figures, and initially to FIG. 1, there is illustrated a schematic circuit diagram of a thermochromic game piece 100 which includes therein a thermochromic battery tester 102. The thermochromic battery tester 102 includes a battery tester display 104 and a conductive substrate 106. Also included is a prize verification display 108 which utilizes the same conductive substrate 106 as the thermochromic battery tester 102. The conductive substrate 106 is electrically coupled to terminals 110 and 112 in order to permit a battery (not pictured) to be electrically coupled to the thermochromic game piece 100.

Figure 2:
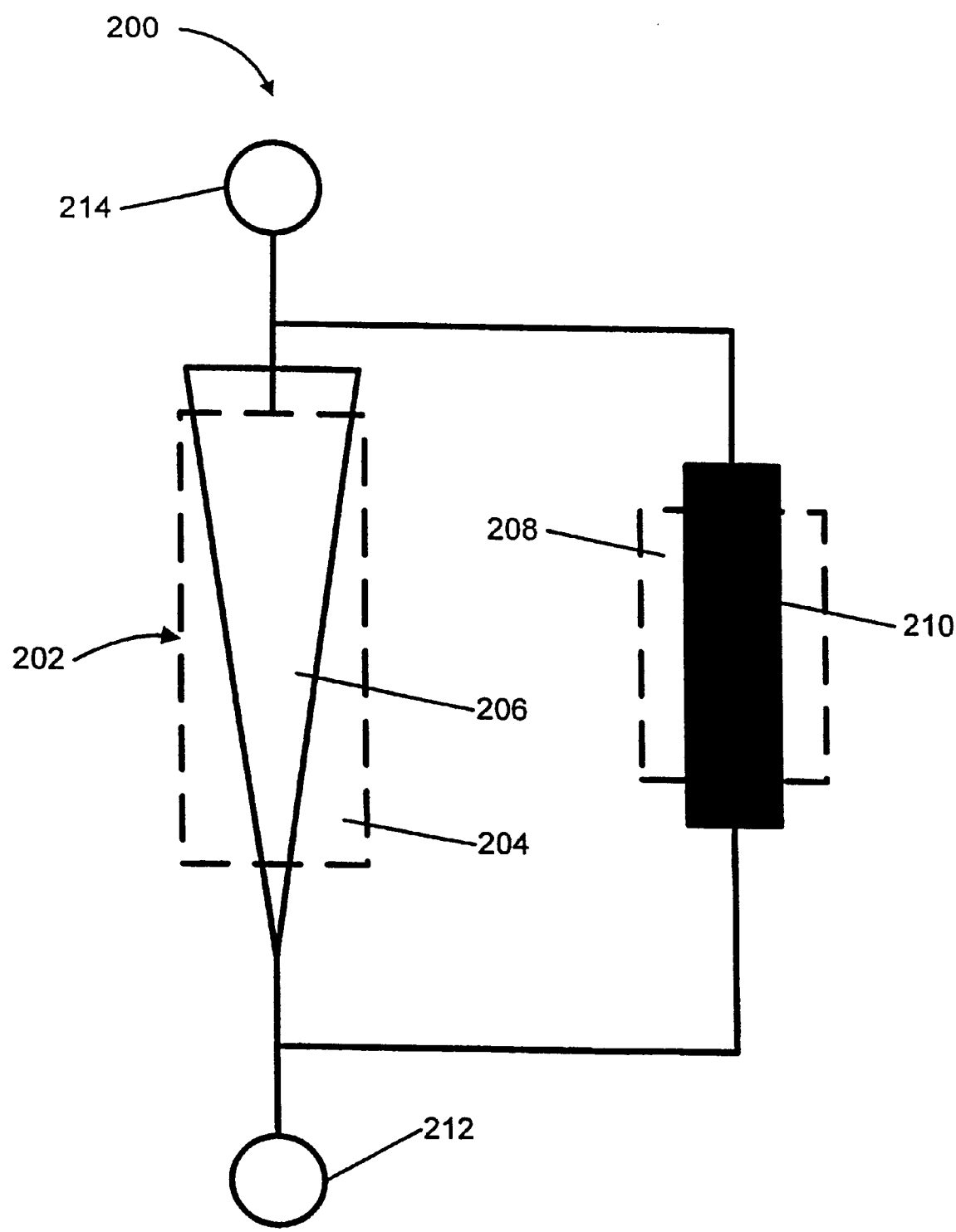
FIG. 2 is a schematic illustration of the circuit of another embodiment of the present invention.

Turning now to FIG. 2, an alternative embodiment is shown for the thermochromic game piece. FIG. 2 illustrates a schematic circuit diagram of a thermochromic game piece 200 which includes therein a thermochromic battery tester 202. The thermochromic battery tester 202 includes a battery tester display 204 and a first conductive substrate 206. Also included is a prize verification display 208 which utilizes a second conductive substrate 210. Both the first and second conductive substrates 206 and 210, respectively, are electrically coupled to terminals 212 and 214 in order to permit a battery to be electrically coupled to the thermochromic game piece 200.

By employing a second thermally responsive display thermally coupled to the conductive substrate, as seen in FIG. 1, or an extension of the conductive substrate, as seen in FIG. 2, a game piece or prize indicator can be incorporated into the battery tester. Consequently, when a person tests a battery the first thermally responsive display reveals the state of charge of the battery and the second thermally responsive display reveals whether a person has won a prize. Alternatively, a selected message may be revealed. In other embodiments of the invention, a person may move a switch to activate the battery tester or may electrically couple different terminals of a conductive substrate to the battery to activate the prize verification thermally responsive display. In another embodiment, both thermally responsive displays can be incorporated as a single thermally responsive display providing indications of both battery charge and prize verification.

A change in the thermally responsive material in the prize indicator display reveals a printed message, icon or other symbol concealed by the thermally responsive material when not coupled with a battery. The particular message, icon or symbol revealed by the thermally responsive material may indicate, for example, whether a prize has been won. The mere change in color may also indicate a message or whether a person has won a prize.

The thermochromic material may be reversible so that after the prize indicator is uncoupled from the battery, the prize indication is again concealed. The thermochromic material may alternatively be irreversible so that after the prize indicator is uncoupled from the battery, the prize indication remains.

Including a prize indicator in packaging materials, such as the packaging materials for batteries, may be advantageous. Including the prize indicator on a battery may also be advantageous. Measures may be taken to make the package and/or prize indicator tamper resistant so that the prize indicator cannot be seen or cannot be coupled to the battery until the battery is removed from the packaging. A serial number for verification of winning the prize may also be included with the battery or revealed by the thermally responsive material. As noted above, the temperature responsive display may serve functions other than prize notification or validation, including the display of messages in general.

What is claimed is:

1. A thermochromic game piece comprising:
    a thermochromic battery tester comprising a thermally responsive battery tester display and a conductive substrate, wherein the conductive substrate is electrically coupled to at least two terminals; and
    a thermally responsive prize verification display, wherein the thermally responsive prize verification display is electrically coupled to the conductive substrate of the thermochromic battery tester,
    wherein the at least two terminals permit the thermochromic game piece to be placed into contact with a battery which when in contact with the thermochromic game piece provides a voltage to the thermochromic game piece thereby revealing a desired message indicia.

2. The thermochromic game piece of claim 1 wherein the thermochromic game piece is mounted directly on the battery.

3. The thermochromic game piece of claim 1 wherein the desired message indicia is a prize determining indicia.

4. The thermochromic game piece of claim 3 wherein the prize determining indicia is selected from the group consisting of a printed verbal message, an icon and a color change.

5. A thermochromic game piece comprising:
    a thermochromic battery tester comprising a thermally responsive battery tester display and a first conductive substrate, wherein the first conductive substrate is electrically coupled to at least two terminals;
    a thermally responsive prize verification display; and
    a second conductive substrate, wherein the second conductive substrate is electrically coupled to at least two terminals,
    wherein the at least two terminals permit the thermochromic game piece to be placed into contact with a battery which when in contact with the thermochromic game piece provides a voltage to the thermochromic game piece thereby revealing a desired message indicia.

6. The thermochromic game piece of claim 5 wherein the thermochromic game piece is mounted directly on the battery.

7. The thermochromic game piece of claim 5 wherein the desired message indicia is a prize determining indicia.

8. The thermochromic game piece of claim 7 wherein the prize determining indicia is selected from the group consisting of a printed verbal message, an icon and a color change.

9. A method for delivering a message via a thermochromic game piece, comprising the steps of:
    placing a battery into contact with a thermally responsive prize verification display via a conductive substrate; and
    generating heat in the conductive substrate using energy from the battery, to produce a visual indication in the thermally responsive prize verification display, wherein the thermally responsive prize verification display reveals a desired message indicia.

10. The method of claim 9 wherein the thermochromic game piece is mounted directly on the battery.

11. The method of claim 9 wherein the desired message indicia is a prize determining indicia.

12. The thermochromic game piece of claim 11 wherein the prize determining indicia is selected from the group consisting of a printed verbal message, an icon and a color change.

13. A method for delivering a message via a thermochromic game piece, comprising the steps of:
    placing a battery into contact with a thermochromic battery tester and a thermally responsive prize verification display via first and second conductive substrates respectively; and
    generating heat in the second conductive substrate using energy from the battery, to produce a visual indication in the thermally responsive prize verification display, wherein the thermally responsive prize verification display reveals a desired message indicia.

14. The method of claim 13 wherein the thermochromic game piece is mounted directly on the battery.

15. The method of claim 13 wherein the desired message indicia is a prize determining indicia.

16. The thermochromic game piece of claim 14 wherein the prize determining indicia is selected from the group consisting of a printed verbal message, an icon and a color change.

* * * * *